(12) United States Patent
Davies

(10) Patent No.: US 11,461,660 B1
(45) Date of Patent: Oct. 4, 2022

(54) FREQUENCY-DOMAIN IMPEDANCE SENSING SYSTEM AND METHOD FOR NEURAL NETWORK PREDICTION OF IMPENDING FAILURE MODES

(71) Applicant: Rockwell Collins, Inc., Cedar Rapids, IA (US)

(72) Inventor: Orion Davies, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 385 days.

(21) Appl. No.: 16/823,811

(22) Filed: Mar. 19, 2020

(51) Int. Cl.
 *G06N 3/08* (2006.01)
 *G01R 31/316* (2006.01)
 *G06N 3/04* (2006.01)
 *H03M 1/12* (2006.01)

(52) U.S. Cl.
 CPC ............ *G06N 3/088* (2013.01); *G01R 31/316* (2013.01); *G06N 3/0454* (2013.01); *H03M 1/12* (2013.01)

(58) Field of Classification Search
 None
 See application file for complete search history.

(56) References Cited

U.S. PATENT DOCUMENTS

| | | | |
|---|---|---|---|
| 7,023,374 B2 | 4/2006 | Jossef et al. | |
| 7,138,815 B1 | 11/2006 | Alexander et al. | |
| 7,138,820 B2 | 11/2006 | Goetting et al. | |
| 2004/0027118 A1 | 2/2004 | Lenz et al. | |
| 2006/0170367 A1* | 8/2006 | Bhutta | H01J 37/32174 315/111.21 |
| 2018/0259579 A1 | 9/2018 | Sobolewski et al. | |
| 2019/0121350 A1* | 4/2019 | Celia | H04L 1/0002 |
| 2019/0383873 A1 | 12/2019 | Hojabri et al. | |

* cited by examiner

*Primary Examiner* — Harry S Hong
(74) *Attorney, Agent, or Firm* — Suiter Swantz pc llo

(57) ABSTRACT

A system and method for monitoring a circuit for impending failure includes measuring changes to frequency-domain impedance with a pair of analog-to-digital converters connected to a conductor while powering up, with or without interposing a series sense resistor for measuring applied current. Changes to frequency-domain impedance or power delivery voltage ratio are identified via a neural network trained to identify frequency-domain impedance associated with normal system behavior and general system failure mode. The neural network may be further trained to produce a predictive probability of specific failure mode types.

15 Claims, 9 Drawing Sheets

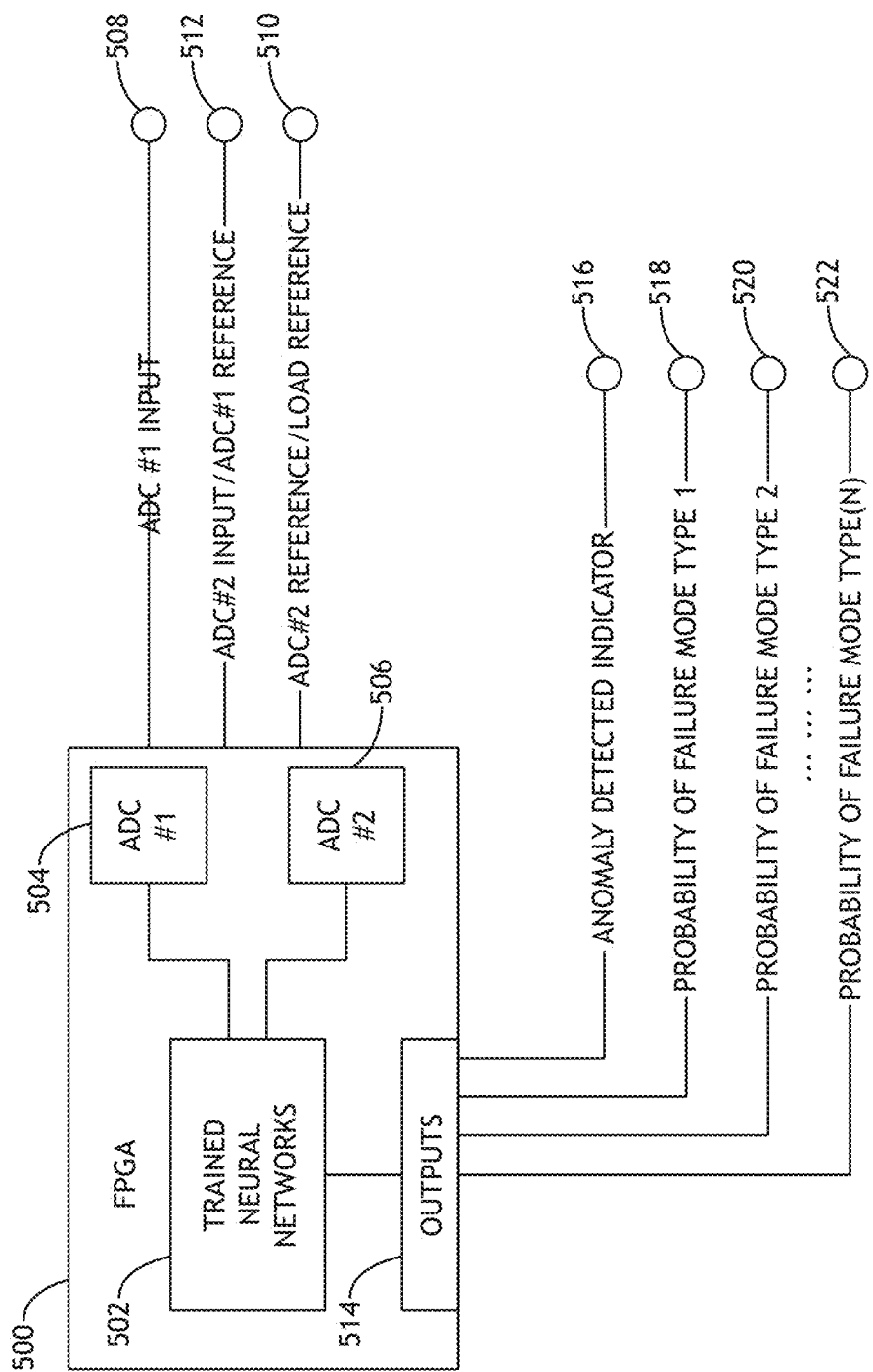

US 11,461,660 B1

FREQUENCY-DOMAIN IMPEDANCE SENSING SYSTEM AND METHOD FOR NEURAL NETWORK PREDICTION OF IMPENDING FAILURE MODES

BACKGROUND

Fault states in electronic components are difficult to predict. Physical elements may change over time and with use; such changes can be predictive of component or system failure if they can be detected. Previous attempts to detect those changes involve complex sensing circuitry and algorithms, often imposing additional elements into the electronic design. Direct Current (DC) voltage measurements cannot detect changes to the complex frequency-domain impedance of circuits. DC current measurements cannot detect changes to the complex frequency-domain impedance of circuits and also require a sensing resistor element to be physically inserted in series into the electronic component.

SUMMARY

In one aspect, embodiments of the inventive concepts disclosed herein are directed to a system and method for monitoring a circuit for impending failure via changes to complex frequency-domain impedance measured by a pair of analog-to-digital converters connected to a conductor and its electronic load while powering up.

In a further aspect, changes to frequency-domain impedance are identified via an architecture of one or more neural networks trained to identify frequency-domain impedance associated with a general system failure. Various neural network architectures may be further trained to produce a predictive probability of specific types of failure modes.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which:

FIG. 5 shows a block diagram of a circuit sensing system and method according to exemplary embodiment;

DETAILED DESCRIPTION

Figure 1:
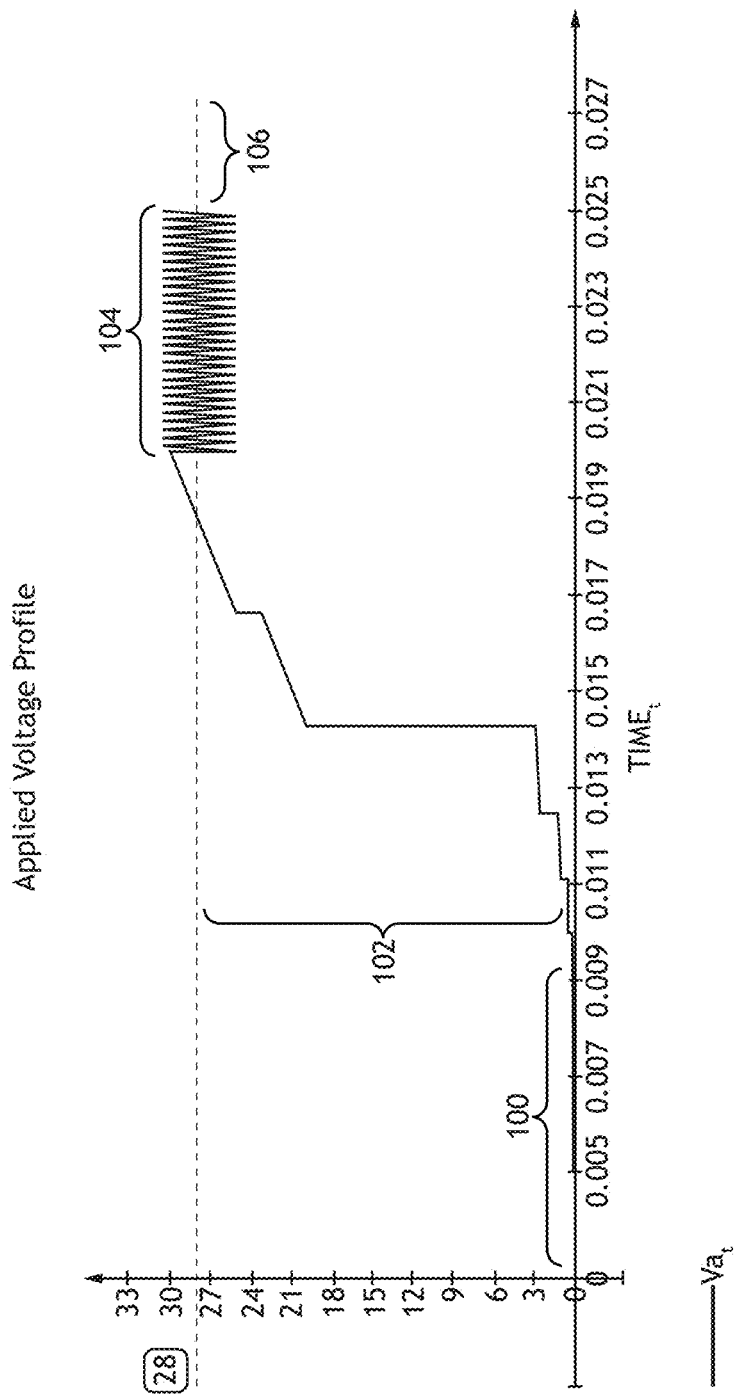
FIG. 1 shows a graph of a simulated voltage profile applied at circuit startup.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein, a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system and method for monitoring a circuit for impending failure via changes to frequency-domain impedance measured by a pair of analog-to-digital converters connected to a conductor while powering up. Furthermore, embodiments of the inventive concepts disclosed herein are directed to a system and method for monitoring a circuit for impending failure via changes to frequency-domain power delivery voltage ratio as measured by a pair of analog-to-digital converters connected to a conductor while powering up. Changes to frequency-domain impedance or power delivery voltage ratio are identified via one or more neural networks trained to identify frequency-domain impedance or power delivery voltage ratio associated with normal system operation to enable detection of impending general system failure. Additional neural networks may be further trained on the outputs from the detection networks to produce a predictive probability of specific types of failure modes.

Referring to FIG. 1, a graph of a simulated voltage profile applied at circuit startup from a DC power source is shown. It is apparent to one practiced in the art that a power-on direct current voltage does not produce an immediate step change in voltage from zero to the steady state voltage instantaneously, and that FIG. 1 is a generic representation of a direct current voltage source being switched on. A voltage profile during a direct current, power-on sequence has frequency content, and in the time domain may be divided into a low or off voltage portion 100, a ramp-up portion 102, and a transient portion 104 before settling into a steady state voltage level 106. Steps in the ramp-up portion 102 and the specific characteristics of the transient portion 104 are dependent on features of the electronic component and its power source. When a power-on voltage is applied, the Fourier Transform of the ratio of circuit load voltage profile to the sensed load current profile represents the complex frequency-domain impedance of the complex circuit load. When a power-on voltage is applied, the Fourier Transform of the ratio of circuit load voltage profile to the sensed current voltage profile represents the complex frequency-domain power delivery voltage ratio of the complex circuit load, and shows that the value of series input resistance can be unknown and still provide a detectible change in the frequency domain for two circuit loads under comparison that differ only by a small amount in the imaginary (reactive) part of the complex values.

Physical properties of a power delivery network (decoupling capacitors, elevating temperature on series inductors, shorting across a section of inductor coils, opening solder connections on device or component ground pins, damage to capacitor dielectric material, tin whisker growth, other types of electrical component degradation, etc.) define the frequency-domain impedances and can be reflected in the Fourier Transform of the ratio of the power-on voltage profile across the circuit load to the power-on current profile delivered to the load. Any physical change to the material components or circuit structure may cause a direct change to the frequency-domain impedance response for a fixed power-on voltage profile. These same physical changes may not be detectable by DC components that monitor steady state voltages or steady state currents. The complex frequency-domain impedance or power delivery voltage ratio may indicate changes to only the reactive or imaginary part of the circuit load.

Figure 2:
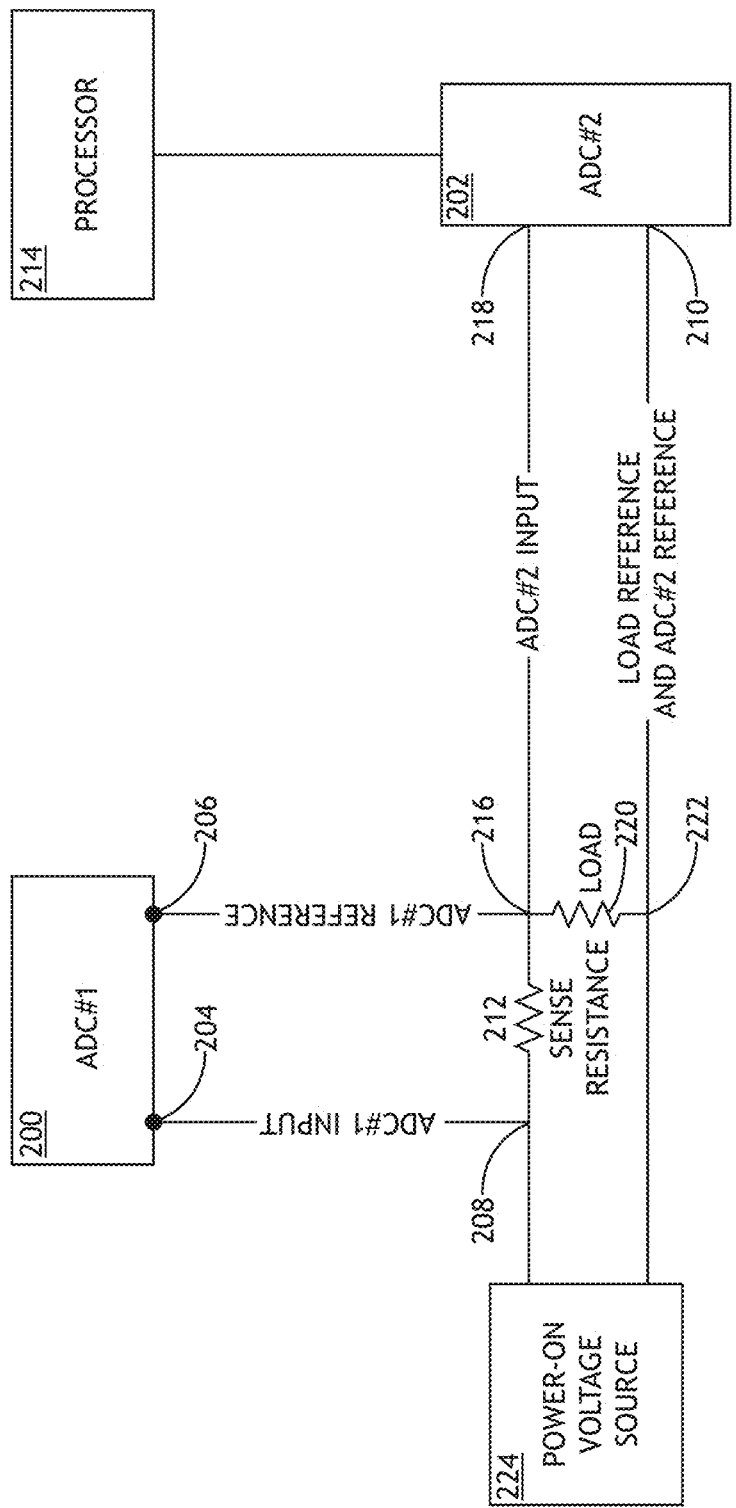
FIG. 2 shows a block diagram of a circuit according to an exemplary embodiment.
Figure 3A:
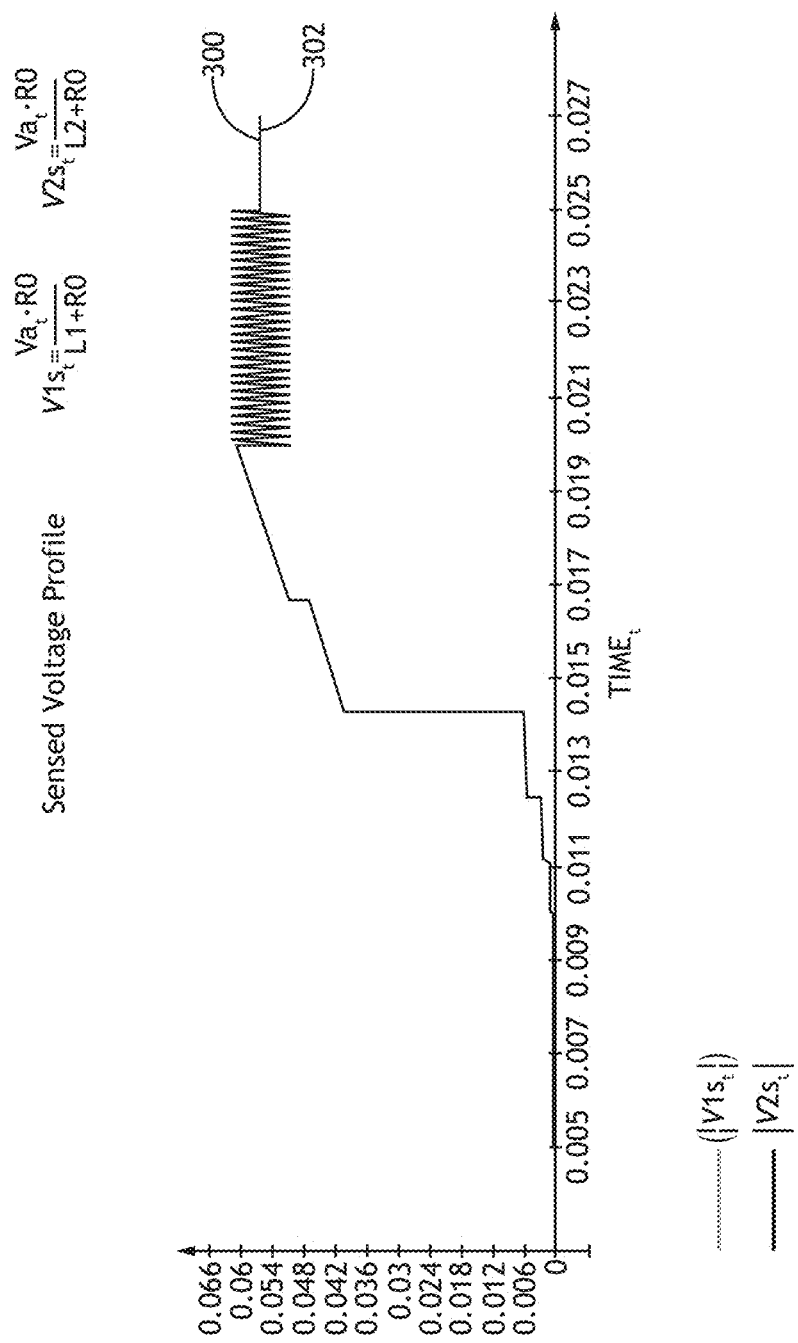
FIG. 3A shows graphs of sensed voltage profiles from a first analog-to-digital converter for two different circuit loads under comparison according to an exemplary embodiment.
Figure 3B:
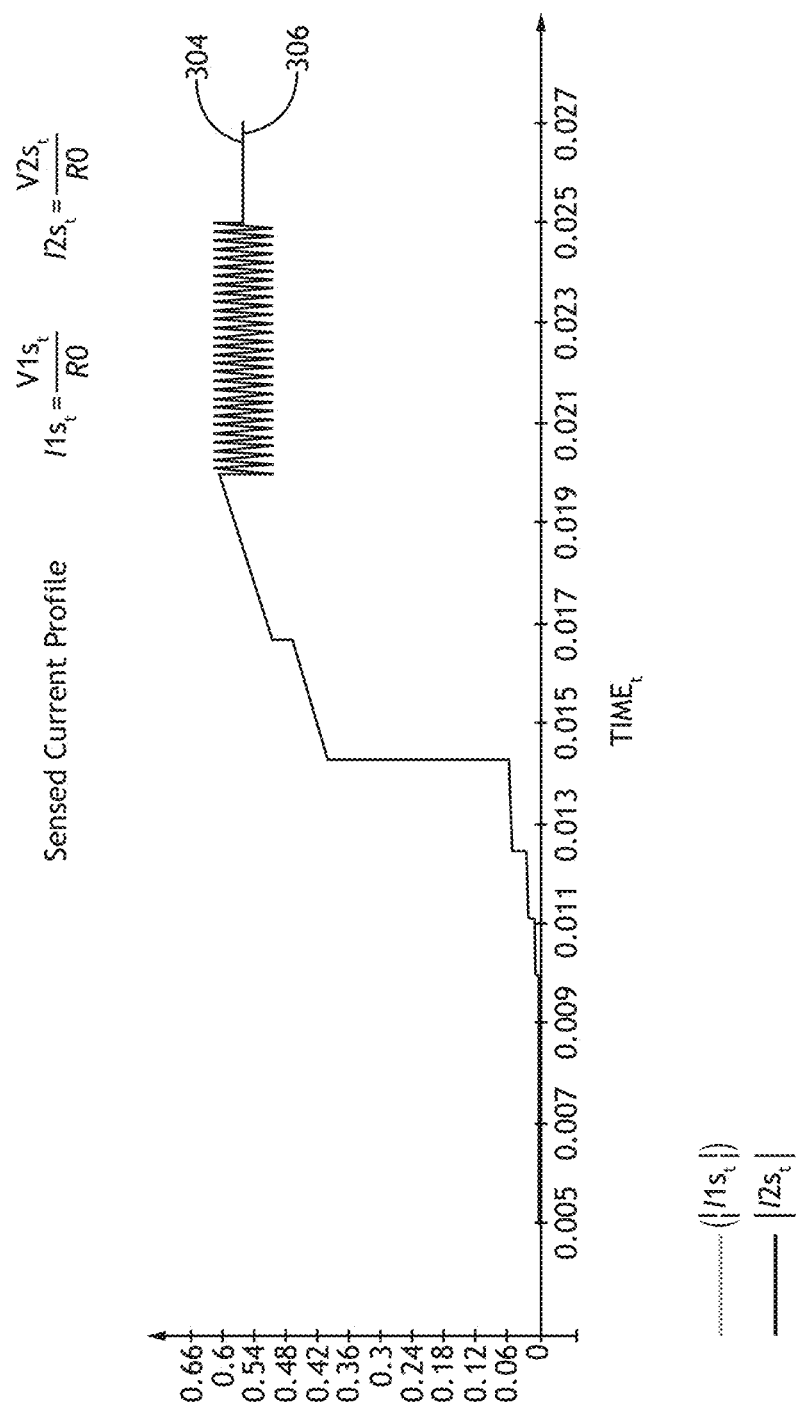
FIG. 3B shows graphs of sensed current profiles from the first analog-to-digital converter for the same two circuit loads under comparison according to an exemplary embodiment.
Figure 3C:
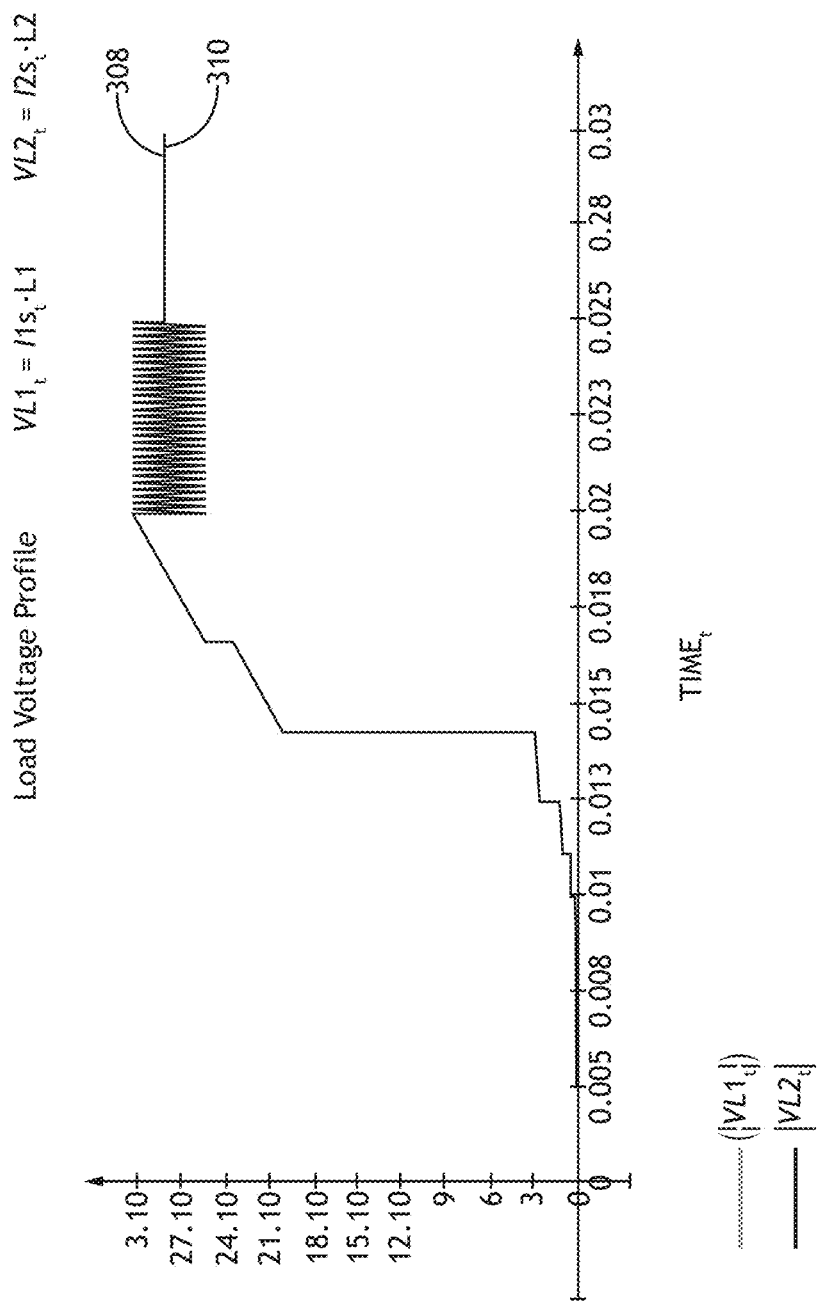
FIG. 3C shows graphs of load voltage profiles from a second analog-to-digital converter for the same two circuit loads under comparison according to an exemplary embodiment.
Figure 3D:
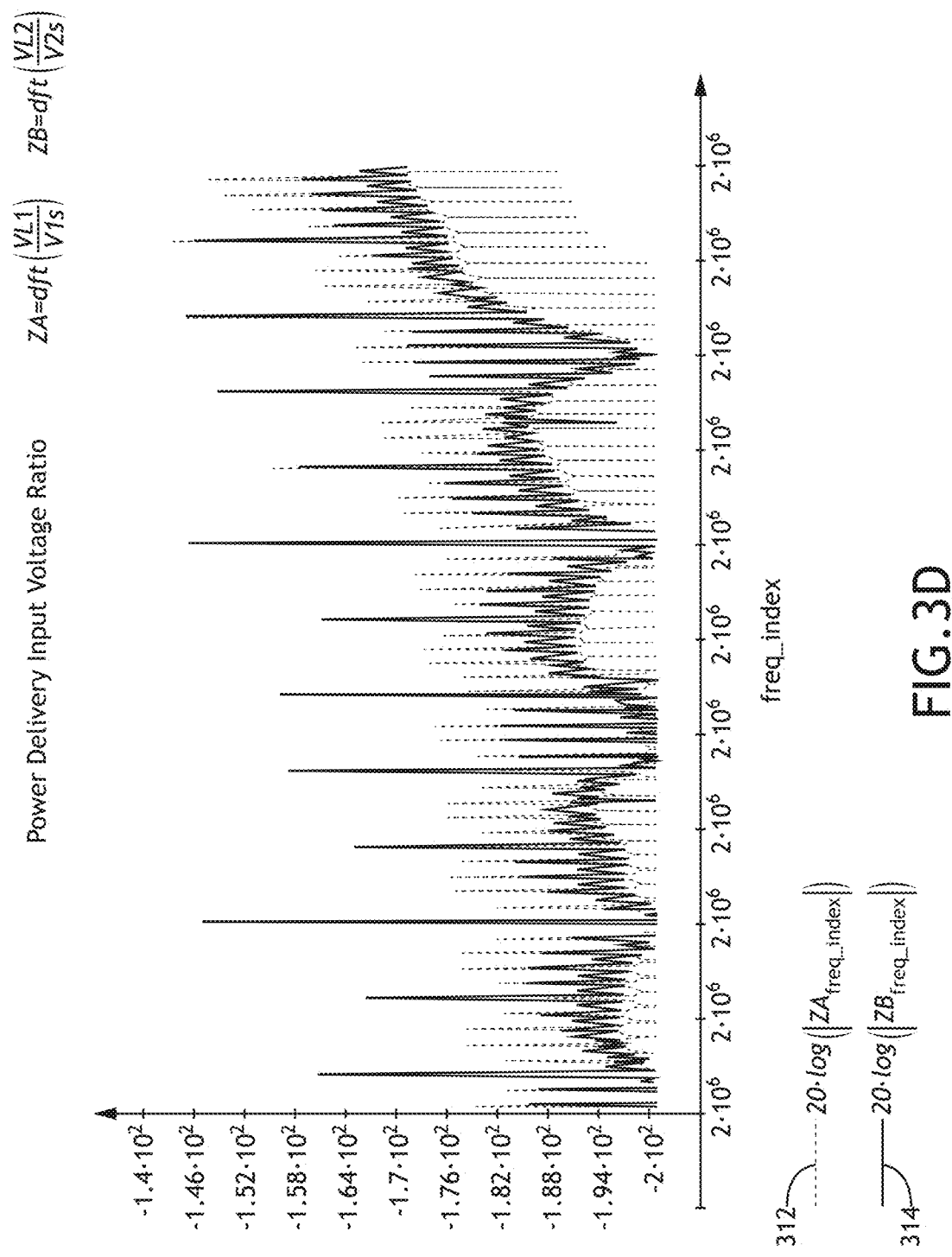
FIG. 3D shows graphs of power delivery input voltage ratios for the same two circuit loads under comparison in the frequency-domain according to an exemplary embodiment.
Figure 3E:
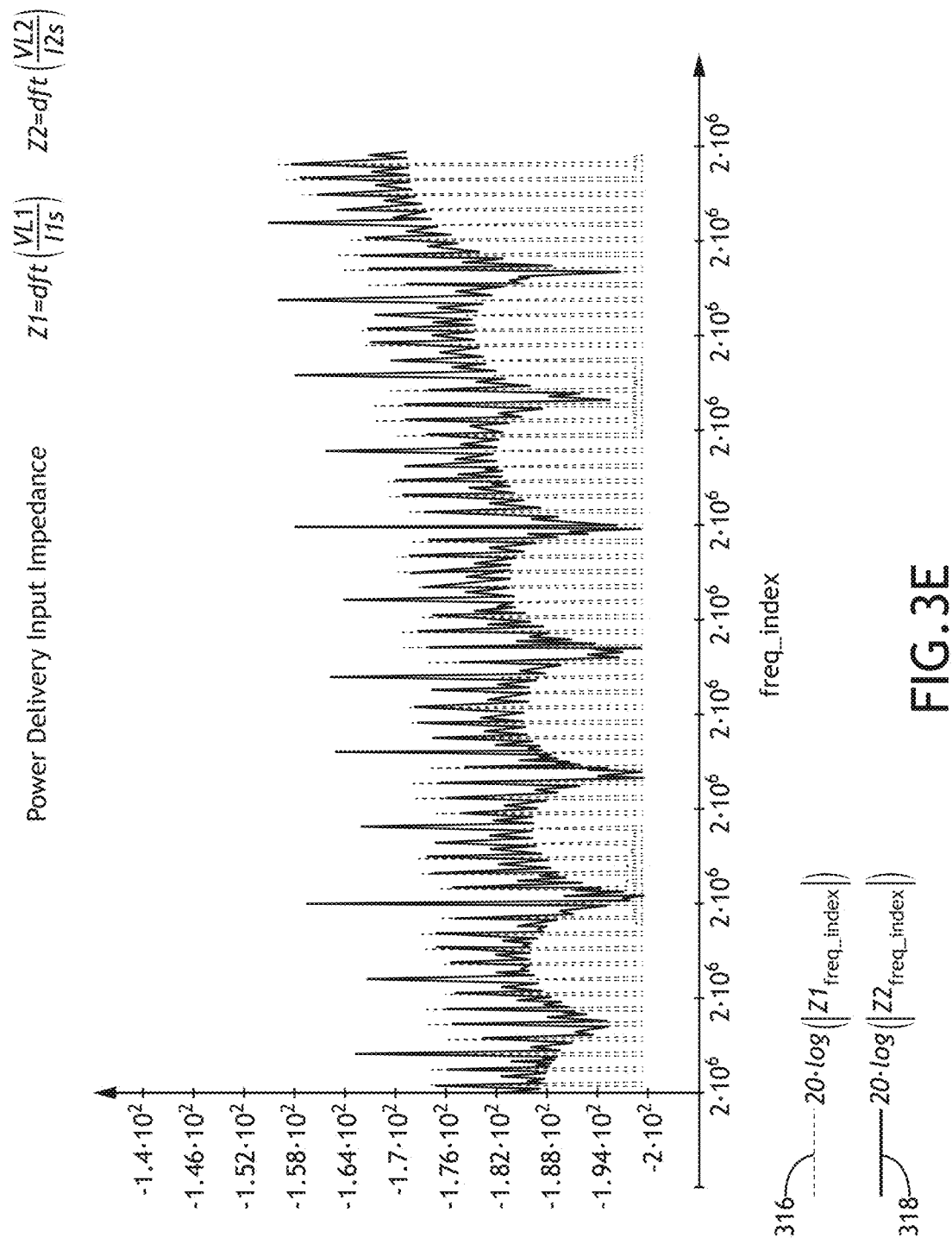
FIG. 3E shows graphs of power delivery input impedance ratios for the same two circuit loads under comparison in the frequency-domain according to an exemplary embodiment.

Referring to FIG. 2, a block diagram of a circuit according to an exemplary embodiment is shown. The circuit comprises a first analog-to-digital converter 200, a second analog-to-digital converter 202, and a processor 214 configured to receive digital outputs from the first analog-to-digital converter 200 and second analog-to-digital converter 202. In at least one embodiment, voltage signal conditioning may be applied for the input signals to the analog-to-digital converters 200, 202. In at least one embodiment, the first analog-to-digital converter 200 has a first terminal 204 connected to a first point on a circuit conductor 208 of an electronic component with a power-on voltage source 224, and a second (reference) terminal 206 connected at the input terminal 216 of the circuit load 220. Likewise, the second analog-to-digital converter 202 has a first terminal 218 connected at the input terminal 216 of the circuit load 220 and a second (reference) terminal 210 connected at the reference terminal 222 of the circuit load 220. In at least one embodiment, the first point on the circuit conductor 208 and the second point on the circuit conductor 216 are separated by a physical length of conductor which has some electrical resistance 212, but no actual resistor element. In at least one embodiment, the small amount of series electrical resistance 212 in the physical length of conductor between the two terminals 208, 216 of the first analog-to-digital converter 200 can effectively eliminate the need for a series current sense resistor to be physically inserted in order to measure the applied current profile.

In at least one embodiment, the signal from the first terminal 204 of the first analog-to-digital converter 200, with reference to the terminal 206 connected to load input 216, is a time-domain voltage signal representing the sensed time-domain current input to the load 220. Likewise, the signal from the first terminal 218 of the second analog-to-digital converter 202, with reference to the terminal 210 connected to load reference terminal 222, is a time-domain voltage signal representing the voltage delivered to load 220. These two time-domain voltage signals are sampled for a period of time from an initial power-on event until the transient region settles to a steady state voltage.

In at least one embodiment, the sense resistance 212 may be assumed constant for a constant power-on voltage profile from power-on voltage source 224. This assumption allows for the voltage signal input to the second analog-to-digital converter 202 divided by the voltage signal input to the first analog-to-digital converter 200 to directly represent the time-domain impedance of the load 220. The processor 214 computes a Fourier Transform of this time-domain voltage ratio to determine the frequency-domain profile of load 220 under a constant power-on profile from voltage source 224.

In at least one embodiment, mapping the frequency-domain impedance profile requires quantifying both the series input current to the load and the voltage applied to the load at the same moments in time for a sample duration. In at least one embodiment, mapping the frequency-domain power delivery voltage ratio profile requires quantifying both the series input voltage drop from the power source to the load and the voltage applied to the load at the same moments in time for a sample duration. This sample duration may be from the initial power-on event until a steady state voltage is reached. Alternatively, or in addition, the sample duration may include any power or voltage transient event. Measuring input current values traditionally requires inserting a sense resistor in series, which is disruptive to the circuit. The sense resistance 212 may be a physical component inserted in series with the conductor 208, or may be simply the physical length of conductor between connection points 208, 216 used by the analog-to-digital converters 200, 202. Embodiments of the present disclosure may be implemented without inserting a sense resistor in the conductor, and may therefore be easily retrofitted onto existing electronic components or systems. It should be readily apparent to one practiced in the art that in at least one embodiment, some form of signal conditioning (impedance matching, signal amplification, voltage level translation, etc.) may be required to meet input conditions required by the analog-to-digital converters.

Referring to FIGS. 3A-3E, graphs of sensed voltage profiles, sensed current profiles, load voltage profiles, power delivery input voltage ratios, and power delivery input impedances ratios according to exemplary embodiments are shown for two circuit load impedances, designated as L1 and L2. For purposes of describing the concepts herein the two circuit load impedances being compared in each figure differ only in the imaginary part of their complex value. For the exemplary embodiment shown L1 has a value of 50−j2 ohms, and L2 has a value of 50−j5 ohms, although these values remain unknown quantities throughout the system and method described. Analog-to-digital converters are configured to sense voltage profiles at startup (but embodiments are also useful during some other power or voltage transient event such as digital signal transitions); a first analog-to-digital converter senses voltage profiles 300, 302 across a sense resistance R0, which may comprise a length of conductor and may also remain an unknown but constant quantity of 0.1+j0.001 ohms for this exemplary embodiment of the system and method described. A first voltage profile 300 corresponds to complex circuit load L1, and a second voltage profile 302 corresponds to complex circuit load L2. Such profiles 300, 302 are measured with respect to startup time. In at least one embodiment, the first voltage profile 300 $V1_{s_t}$ and second voltage profile 302 $V2_{s_t}$ may be defined by a voltage from a voltage source $V_a$, the sense resistance R0, a first load impedance L1, and a second load impedance L2 such that:

$$V1_{s_t}=V_{a_t}*R0/L1+R0, V2_{s_t}=V_{a_t}*R0/L2+R0$$

The corresponding current profiles 304, 306 ($I1_{s_t}$ and $I2_{s_t}$ respectively) are defined with respect to each complex circuit load such that:

$$I1_{s_t}=V1_{s_t}/R0, I2_{s_t}=V2_{s_t}/R0$$

A second analog-to-digital converter senses the applied load voltage profiles 308, 310. A first load voltage profile 308 corresponds to complex circuit load L1, and a second load voltage profile 310 corresponds to complex circuit load L2 ($VL1_t$ and $VL2_t$ respectively) where:

$$VL1_t=I1_{s_t}*L1, VL2_t=I2_{s_t}*L2$$

This exemplary embodiment illustrates that for two different complex circuit loads; the voltage applied to load L1 (the first load voltage profile 308) is the same as the voltage applied to load L2 (the second load voltage profile 310), and the value of sense resistance R0 is constant for each load. A first power delivery input voltage ratio profile 312 for complex circuit load L1, and a second power delivery input voltage ratio profile 314 for complex circuit load L2 may be computed as the discrete Fourier transformation of $VL1_t$ over the discrete Fourier transformation of $V1_{s_t}$ for L1, and the discrete Fourier transformation of $VL2_t$ over the discrete Fourier transformation of $V2_{s_t}$ for L2. The corresponding profiles 312, 314 are complex value functions of frequency.

It may be appreciated that power delivery input impedance profiles 316, 318 may be computed as the discrete Fourier transformation of $VL1_t$ over the discrete Fourier transformation of $i1_{s_t}$, and the discrete Fourier transformation of $VL2_t$ over the discrete Fourier transformation of $I2_{s_t}$, using a value of R0=0.1−j0.001 ohms. The power delivery input impedance profiles 316, 318 are complex value functions of frequency. It may be appreciated that such computation requires the value of R0 to be known, whereas computation of the power delivery input voltage ratios 312, 314 do not require the value of R0 to be known.

Embodiments of the present disclosure may utilize one or more of the sensed or computed profiles 300, 302, 304, 306, 308, 310, 312, 314, 316, 318 may be used to identify frequency-domain impedance or power delivery input voltage ratio characteristics or fluctuations that may indicate changes to certain components that may be used to predict a system failure. It may be appreciated that changes to these characteristics are only detectible in the frequency domain.

Figure 4:
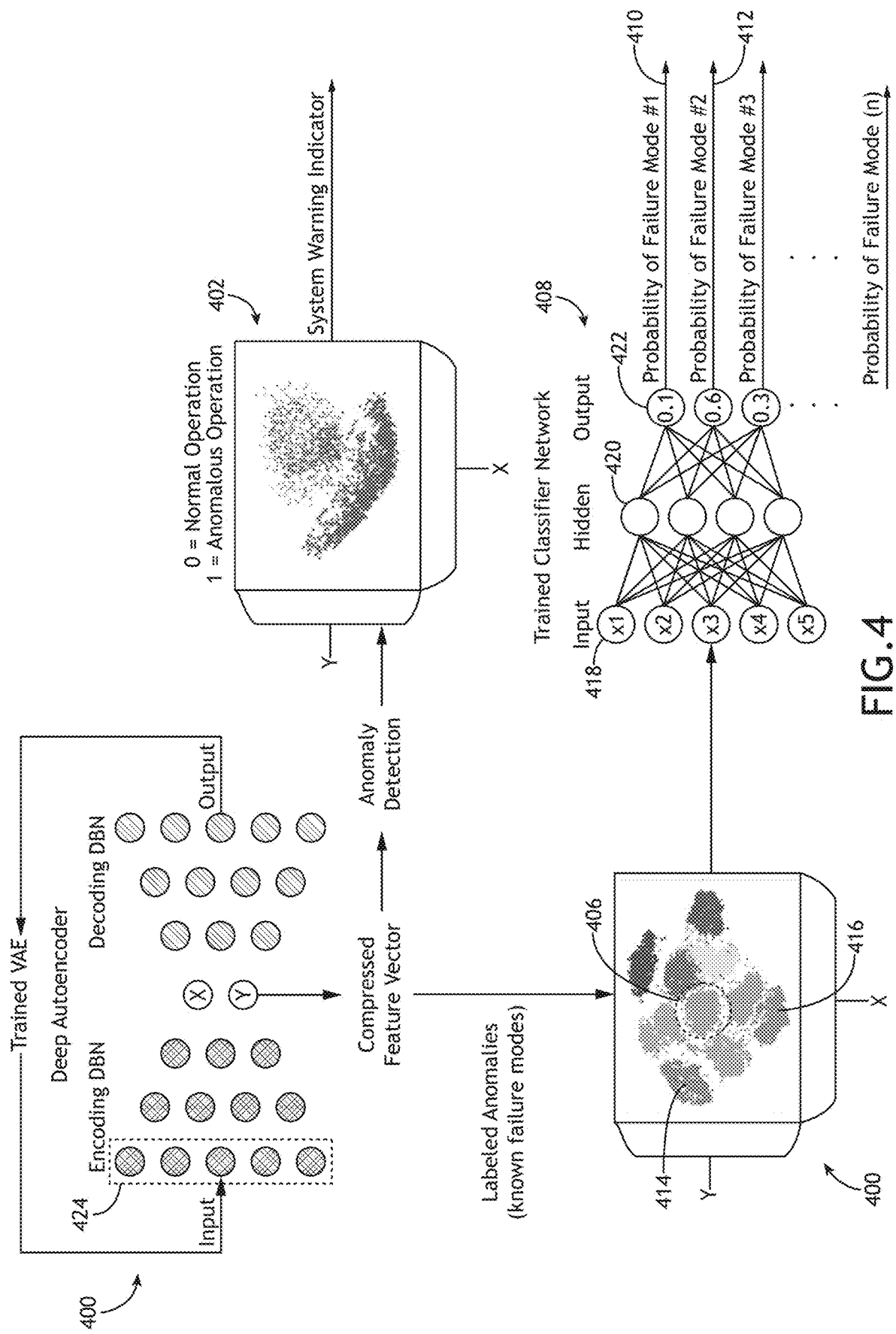
FIG. 4 shows a block representation of exemplary embodiments of systems and methods for identifying failure states in a circuit.

Referring to FIG. 4, a block representation of exemplary embodiments of systems for identifying one or more failure mode types in a circuit is shown. In at least one embodiment, a processor analyzing frequency-domain impedance or power deliver input voltage ratio profiles is configured and trained as a variational autoencoder neural network 400 having a plurality of layers 424. In such configuration, the processor produces an output indicating a normal power-on process or an anomalous power-on process. Such normal or anomalous outputs may be trained via a dataset representing a map 402 of possible comparison values. The map 402 may comprise the compressed low dimensional representation of frequency-domain impedance profiles. In at least one embodiment the latent space is compressed down to only two dimensions for illustrative purposes.

In at least one embodiment, unsupervised learning of the variational auto encoder neural network 400 may be employed to represent the latent space in any applied profile and may be used to detect anomalies indicative of approaching failure.

Alternatively, or in addition, the processor is configured as a trained neural network 408 classifier comprising a plurality of input nodes 418, intermediate nodes 420, and output nodes 422 to produce a plurality of outputs 410, 412 defining probabilities for impending failure mode types the network is trained to detect. In such configuration, the processor may be trained via a dataset representing a map 404 of possible frequency-domain impedance or power delivery input voltage ratio profile latent space values, where values within a defined boundary 406 indicate a normal power-on process and values outside the defined boundary 406 indicate a possible impending failure mode types. Furthermore, values outside the defined boundary 406 may define clusters or regions 414, 416 of the map 404 indicative of specific failure mode types. In at least one embodiment, a classified output within such defined region 414, 416 may correspond to a processor output 410, 412 indicating a probable failure mode of the corresponding type. Alternatively, the processor outputs 410, 412 may reflect a distance between the actual classified output and the center of each defined region 414, 416.

In at least one embodiment, the neural networks 400, 408 may be trained via direct sampling analog-to-digital converters.

Referring to FIG. 5, a block diagram of a circuit sensing system 500 according to exemplary embodiment is shown and is in agreement with FIG. 2. In one embodiment, the circuit sensing system 500 processor may be comprised of a Field Programmable Grid Array. The system 500 embodies a trained neural network 502 configured to receive signals from a first analog-to-digital converter 504 and a second analog-to-digital converter 506. The first analog-to-digital converter 504 is connected to a power rail or conductor of an electronic component at a first terminal 508, with its reference connected to a second terminal 512 some distance from the first, across a sense resistor component or physical length of power rail or conductor. Likewise the second analog-to-digital converter 506 is connected to the second terminal 512, with its reference connected to a third terminal 510, coincident with the complex circuit load reference. The signal for the first analog-to-digital converter 504 coming from the first terminal 508 may comprise a time-domain voltage waveform over a sample interval with reference to the input of the second analog-to-digital converter 506 connected at the circuit load input terminal 512; likewise the signal for the second analog-to-digital converter 506 coming from the second terminal 512 may comprise a time-domain voltage waveform over a sample interval with reference to the circuit load reference connected at terminal 510. In at least one embodiment, the neural network 502 is trained on the processed time-domain voltage signals without the need to account for any absolute resistance value due to the natural, inherent resistance of the power rail that is constant for a defined power-on voltage profile.

The neural network 502 produces a set of outputs 514. The outputs 514 may comprise a simple indication of a power-on anomaly 516. In one embodiment, this indication may be used to flag the system for preventative maintenance. Alternatively, or in addition, the outputs 514 may comprise distinct probabilities 518, 520, 522 for various power-on failure mode types. Such outputs 514 may be sent to a user or other system health monitoring system.

It may be appreciated that frequency-domain impedance or power delivery voltage ratio changes detected at power-on may be indicative of impending failures other than failures at the time of power-on. For example, a particular frequency-domain impedance or power delivery voltage ratio profile may indicate a structural anomaly likely to cause system blackout during operation, such that the electronic component may lose the required power-on voltage for an interval of time when processing demands suddenly require more current than can be supplied.

While specific embodiment described herein reference power-on rails, the concepts are extendable to any portion of an electronic component with frequency-domain impedance or power delivery voltage ratio profiles associated with a changing applied voltage.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A method for sensing impending failure states in an electronic component or system comprising:

receiving a first signal from a first analog-to-digital converter that is input to a processor, a first terminal of the first analog-to-digital converter connected to an initial point on a conductor supplying an applied voltage to a circuit load and a second terminal of the first analog-to-digital converter connected to the same conductor of the electronic component some physical distance away from the first terminal at a circuit load input terminal;

receiving a second signal from a second analog-to-digital converter that is input to a processor, a first terminal of the second analog-to-digital converter connected to the circuit load input terminal and a second terminal of the second analog-to-digital converter connected to a reference terminal of the circuit load;

computing one or more frequency-domain impedance or power delivery voltage ratio vectors based on a Fourier transformation of one or more time-domain impedance or power delivery voltage ratio vectors;

identifying one or more changes to the frequency-domain impedance or power delivery voltage ratio vectors; and determining that the one or more changes to the frequency-domain impedance or power delivery voltage ratio vectors indicates one or more pending failure states.

2. The method of claim 1, wherein the frequency-domain impedance or power delivery voltage ratio vectors correspond to a startup event.

3. The method of claim 1, further comprising computing the frequency-domain impedance or power delivery voltage ratio vectors based on two or more time-domain voltage profiles sampled over time from the first signal and second signal.

4. The method of claim 1, wherein determining that the frequency-domain impedance or power delivery voltage ratio vectors indicate a pending failure state comprises processing the identified frequency-domain impedance or power delivery voltage ratio vectors via a neural network.

5. The method of claim 4, further comprising determining one or more probabilities, each corresponding to a specific failure mode type, via the neural network, wherein the neural network comprises a classifier neural network.

6. The method of claim 5, further comprising training the neural network via a training set of frequency-domain impedance or power delivery voltage ratio values and specific failure mode types.

7. The method of claim 5, further comprising training the neural network via a training set of analog-to-digital signals originating from at least two analog-to-digital converters connected to a conductor.

8. The method of claim 4, wherein the neural network comprises a variational autoencoder neural network.

9. A circuit for sensing impending failure states in an electronic component comprising:

a first analog-to-digital converter having a first terminal and a second terminal;

a second analog-to-digital converter having a first terminal and a second terminal; and at least one processor connected to the first analog-to-digital converter and the second analog-to-digital converter, wherein:

the first terminal of the first analog-to-digital converter is connected to the electronic component at the conductor applying voltage to a circuit load;

the second terminal of the first analog-to-digital converter is connected to the electronic component at a circuit load input terminal, wherein both terminals of the first analog-to-digital converter are also connected across a physical length of the conductor delivering a voltage to the circuit load;

the first terminal of the second analog-to-digital converter is also connected to the electronic component at the circuit load input terminal;

the second terminal of the second analog-to-digital converter is connected to the electronic component at a circuit load reference terminal, wherein both terminals of the second analog-to-digital converter are also connected across the circuit load; and the least one processor is configured to:
  receive a first signal from the first analog-to-digital converter;
  receive a second signal from the second analog-to-digital converter;
  compute one or more frequency-domain impedance or power delivery voltage ratio vectors based on a Fourier transformation of one or more time-domain voltage vectors;
  identify one or more changes to the frequency-domain impedance or power delivery voltage ratio vectors; and
  determine that the one or more changes to the frequency-domain impedance or power delivery voltage ratio vectors indicates one or more pending failure states.

10. The circuit of claim 9, wherein the frequency-domain impedance or power delivery voltage ratio vectors correspond to a power transient event.

11. The circuit of claim 9, wherein the at least one processor is further configured to compute the time-domain impedance or power delivery voltage ratio vectors based on two or more voltage profiles derived over time from the first signal and second signal, and two or more current profiles derived over time from the first signal and second signal.

12. The circuit of claim 9, wherein determining that the frequency-domain impedance or power delivery voltage ratio vectors indicate a pending failure state comprises processing the identified frequency-domain impedance or power delivery voltage ratio vectors via one or more neural networks.

13. The circuit of claim 12, wherein:
  at least one processor is further configured to determine one or more probabilities, each corresponding to a specific failure type, via one or more neural networks; and
  the neural network(s) are comprised of one or more classifier neural network.

14. The circuit of claim 12, wherein the neural network(s) are comprised of one or more variational autoencoder neural networks.

15. The circuit of claim 12, wherein the at least one processor is configured to provide indication of a one or more system failure mode types corresponding to a frequency-domain impedance or power delivery voltage ratio processed by one or more neural networks.

* * * * *